(12) United States Patent
Kuczynski et al.

(10) Patent No.: US 8,431,048 B2
(45) Date of Patent: Apr. 30, 2013

(54) METHOD AND SYSTEM FOR ALIGNMENT OF GRAPHITE NANOFIBERS FOR ENHANCED THERMAL INTERFACE MATERIAL PERFORMANCE

(75) Inventors: Joseph Kuczynski, Rochester, MN (US); Arvind Kumar Sinha, Rochester, MN (US); Kevin Albert Splittstoesser, Stewartville, MN (US); Timothy Jerome Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 12/842,200

(22) Filed: Jul. 23, 2010

(65) Prior Publication Data
US 2012/0018666 A1 Jan. 26, 2012

(51) Int. Cl.
*H05K 7/20* (2006.01)
(52) U.S. Cl.
USPC .......... 252/506; 252/511; 252/503; 264/1.36; 264/437; 264/105; 361/708; 361/709; 361/712; 361/679.54
(58) Field of Classification Search .................. 252/506, 252/511, 503; 264/1.36, 437, 105; 361/708, 361/709, 712
See application file for complete search history.

(56) References Cited

U.S. PATENT DOCUMENTS

| | | | |
|---|---|---|---|
| 6,537,515 B1 | 3/2003 | Baker et al. | |
| 6,721,796 B1 | 4/2004 | Wong et al. | |
| 6,764,759 B2 | 7/2004 | Duvall et al. | |
| 6,891,724 B2 | 5/2005 | De Lorenzo et al. | |
| 7,238,415 B2 | 7/2007 | Rodriguez et al. | |
| 7,270,795 B2 | 9/2007 | Kawakami et al. | |
| 7,387,747 B2 | 6/2008 | Taya et al. | |
| 7,479,516 B2* | 1/2009 | Chen et al. | 524/495 |
| 7,592,389 B2 | 9/2009 | Baker et al. | |
| 7,649,308 B2 | 1/2010 | Lee et al. | |
| 7,674,410 B2 | 3/2010 | Huang et al. | |
| 7,803,262 B2 | 9/2010 | Haik et al. | |
| 2005/0239948 A1* | 10/2005 | Haik et al. | 524/496 |
| 2005/0269726 A1 | 12/2005 | Matabayas, Jr. | |
| 2008/0291634 A1* | 11/2008 | Weiser et al. | 361/708 |
| 2010/0003530 A1* | 1/2010 | Ganguli et al. | 428/457 |

FOREIGN PATENT DOCUMENTS

| | | |
|---|---|---|
| JP | 2009246258 A | 10/2009 |
| JP | 2010034254 A | 2/2010 |
| JP | 2010050259 A | 3/2010 |
| WO | 2004090944 A2 | 10/2004 |
| WO | 2005031864 A1 | 4/2005 |
| WO | 2006044938 | 4/2006 |
| WO | 2007089257 | 8/2007 |

OTHER PUBLICATIONS

Chambers, Alan et al., "Catalytic Engineering of Carbon Nanostructures", Langmuir: The ACS Journal of Surfaces and Colloids, American Chemical Society, Washington DC, USA, vol. 11, No. 10, Oct. 1, 1995, pp. 3862-3866.
International Search Report and Written Opinion of the ISA dated Mar. 5, 2012—International Application No. PCT/EP2011/061063.
Weinstein, R.D., Kopec, Thomas C., Fleischer, A.S., D'Addio, E. and Bessel, C.A., "The Effects of Embedding Phase Change Materials with Graphite Nanofibers for the Thermal Management of Electronics," Journal of Heat Transfer, vol. 130, No. 4, pp. 042405-1-042405-8, 2008.
Kopec, T., Fleischer, A.S., Weinstein, R.D., Bessel, C.A., 2007, "Transient thermal performance of phase change materials with embedded graphite nanofibers," in Thermes 2007: Thermal Challenges in Next Generation Systems, Garimella, S.V. and Fleischer, A.S., eds. , Millpress, Rotterdam, the Netherlands.
Fleischer, A.S., Chintakrinda, K., Weinstein, R.D., Bessel, C.A., "Transient Thermal Management Using Phase Change Materials With Embedded Graphite Nanofibers for Systems With High Power Requirements," Proceedings of the 2008 ITherm Conference, Orlando, FL, May 28-31, 2008.
R. Terry K. Baker, Synthesis, Properties and Applications of Graphite Nanofibers, http://www.wtec.org/loyola/nano/us_r_n_d/09_03.htm.
Rodney S. Ruoff and Donald C. Lorents, Mechanical and thermal properties of carbon nanotubes, Carbon vol. 33, Issue 7, 1995, pp. 925-930.
Gary G. Tibbetts, Growing Carbon Fibers with a Linearly Increasing Temperature Sweep: Experiments and Modeling, Carbon vol. 30, No. 3, pp. 399-406, 1992.
Munehiro Ishioka et al., Formation and Characteristics of Vapor Grown Carbon Fibers Prepared in Linz-Donawitz Converter Gas, Carbon vol. 30, No. 7, pp. 975-979, 1992.
Munehiro Ishioka et al., Formation of Vapor-Grown Carbon Fibers in CO-CO2-H2 Mixtures, I. Influence of Carrier Gas Composition, Carbon vol. 30, No. 6, pp. 859-863, 1992.
International Search Report and Written Opinion of the ISA dated Oct. 2, 2012—International Application No. PCT/IB2012/052398.

\* cited by examiner

*Primary Examiner* — Douglas McGinty
(74) *Attorney, Agent, or Firm* — Stachler Intellectual Property Law LLC

(57) ABSTRACT

The exemplary embodiments of the present invention provide a method and system for aligning graphite nanofibers in a thermal interface material to enhance the thermal interface material performance. The method includes preparing the graphite nanofibers in a herringbone configuration, and dispersing the graphite nanofibers in the herringbone configuration into the thermal interface material. The method further includes applying a magnetic field of sufficient intensity to align the graphite nanofibers in the thermal interface material. The system includes the graphite nanofibers configured in a herringbone configuration and a means for dispersing the graphite nanofibers in the herringbone configuration into the thermal interface material. The system further includes a means for applying a magnetic field of sufficient intensity to align the graphite nanofibers in the thermal interface material.

19 Claims, 5 Drawing Sheets

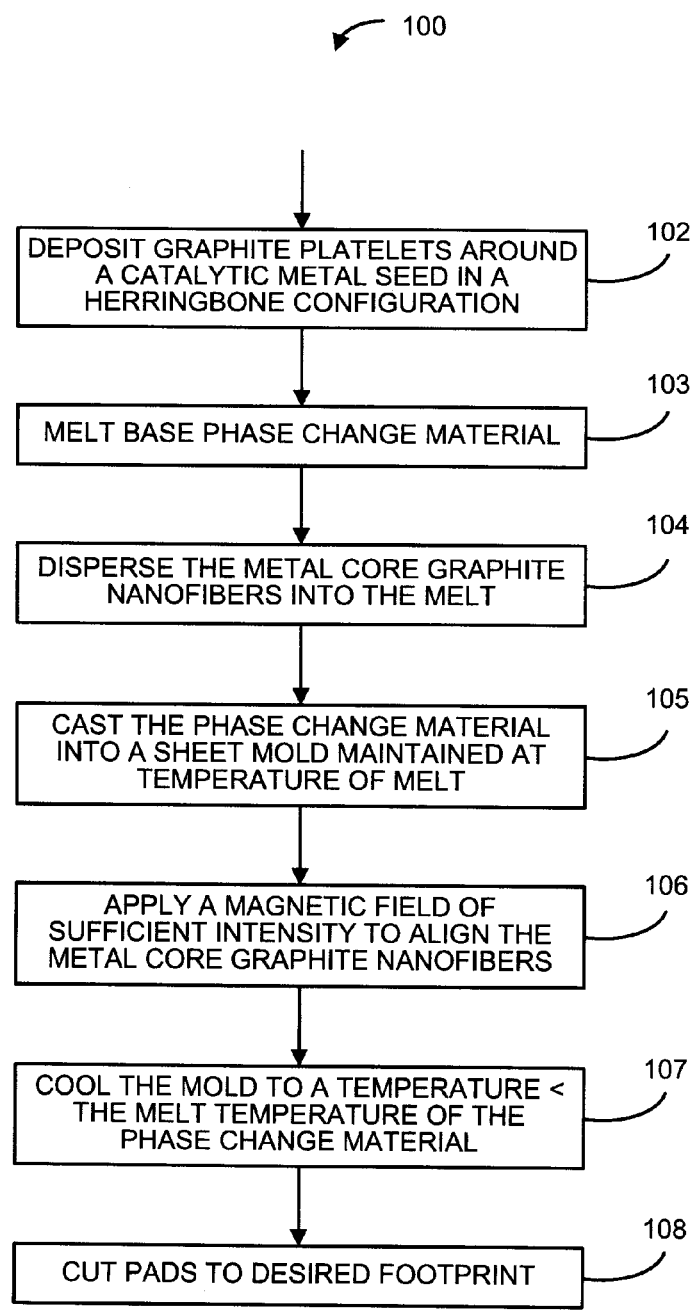

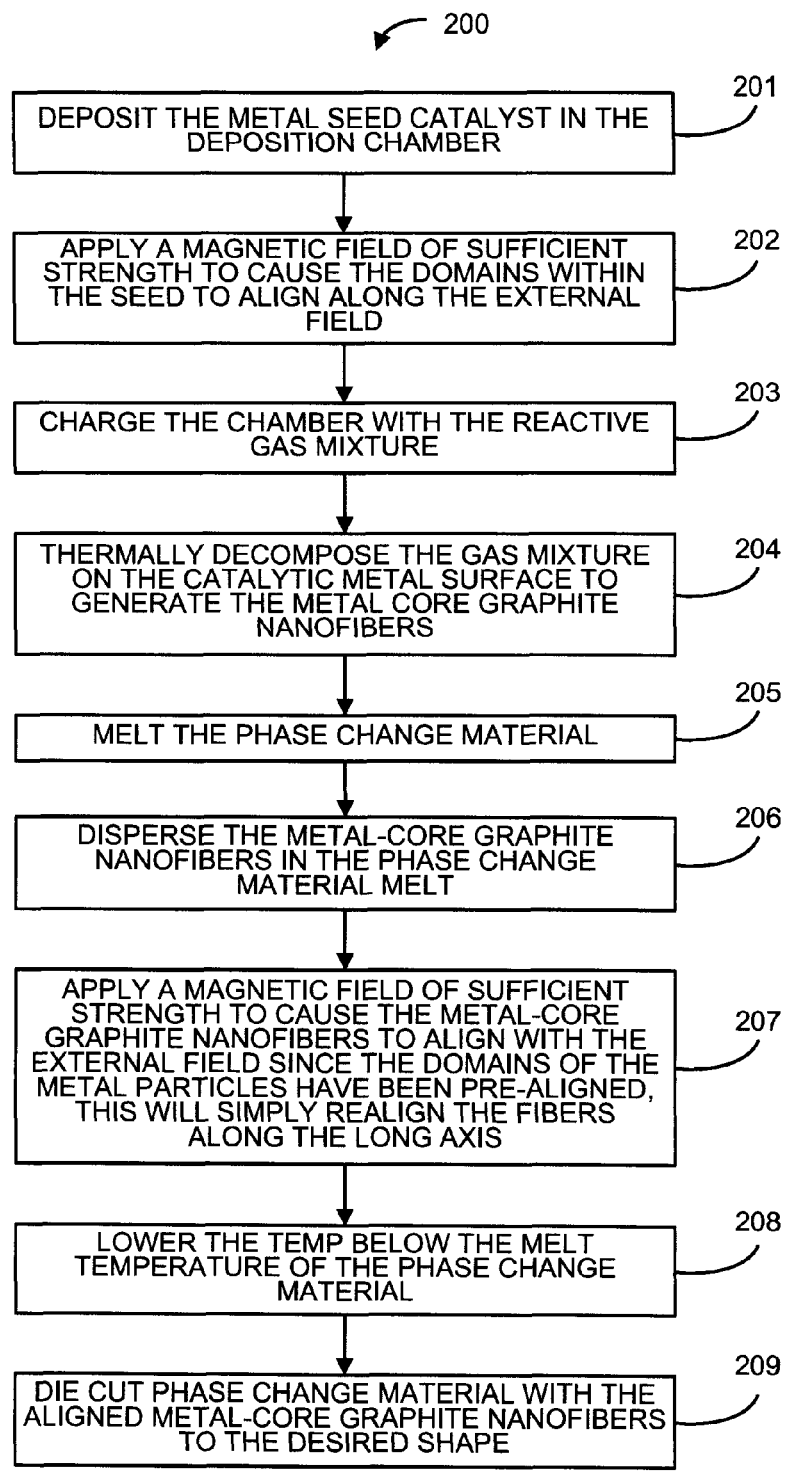

METHOD AND SYSTEM FOR ALIGNMENT OF GRAPHITE NANOFIBERS FOR ENHANCED THERMAL INTERFACE MATERIAL PERFORMANCE

FIELD OF THE INVENTION

The present invention generally relates to thermal interface materials, and more particularly, to a method and system for aligning graphite nanofibers to enhance thermal interface material performance.

BACKGROUND

Thermal interface materials are typically composed of an organic matrix highly loaded with a thermally conductive filler. Thermal conductivity is driven primarily by the nature of the filler, which is randomly and homogeneously distributed throughout the organic matrix. Commonly used fillers exhibit isotropic thermal conductivity and thermal interface materials utilizing these fillers must be highly loaded to achieve the desired thermal conductivity. Unfortunately, these loading levels degrade the properties of the base matrix material (such as flow, cohesion, interfacial adhesion, etc.).

Consequently, the thermal interface material formulator must balance matrix performance with thermal conductivity with the net result being a material with less than optimal thermal conductivity. It is desirable to formulate a thermal interface material with as high a thermal conductivity as possible without sacrificing other physical properties.

BRIEF SUMMARY

Embodiments of the present invention provide a method and system for aligning graphite nanofibers to enhance thermal interface material performance.

An exemplary embodiment includes a method for aligning graphite nanofibers to enhance thermal interface material performance. The exemplary embodiments of the present invention provide a method and system for aligning graphite nanofibers in a thermal interface material to enhance the thermal interface material performance. The method includes preparing the graphite nanofibers in a herringbone configuration, and dispersing the graphite nanofibers in the herringbone configuration into the thermal interface material. The method further includes applying a magnetic field of sufficient intensity to align the graphite nanofibers in the thermal interface material.

Another exemplary embodiment includes a system for aligning graphite nanofibers to enhance thermal interface material performance. Briefly described in terms of architecture, one embodiment of the system, among others, is implemented as follows. The system includes the graphite nanofibers configured in a herringbone configuration and a means for dispersing the graphite nanofibers in the herringbone configuration into the thermal interface material. The system further includes a means for applying a magnetic field of sufficient intensity to align the graphite nanofibers in the thermal interface material.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawing and detailed description of the invention are exemplary and explanatory of preferred embodiments of the invention, and are not restrictive of the invention, as claimed.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 3 is a flow chart illustrating an example of the operation of the aligning system, of the present invention, that aligns metal-core graphite nanofibers dispersed in a thermal interface material.

FIG. 5 is a flow chart illustrating an example of the operation of the pre-aligning system of the present invention, that pre-aligns the magnetic poles of a metal seed that creates the metal-core graphite nanofibers dispersed in a thermal interface material.

Figure 1A:
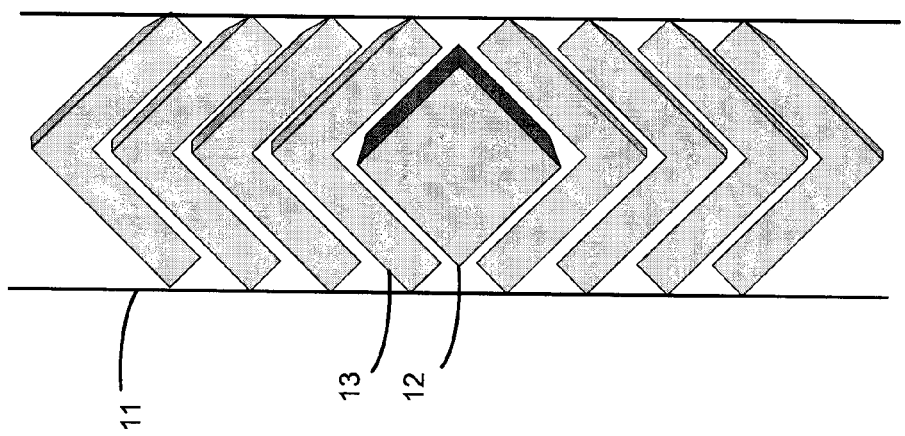
FIG. 1A is a block diagram illustrating an example of a metal-core graphite nanofiber utilized in thermal interface materials.
Figure 1B:
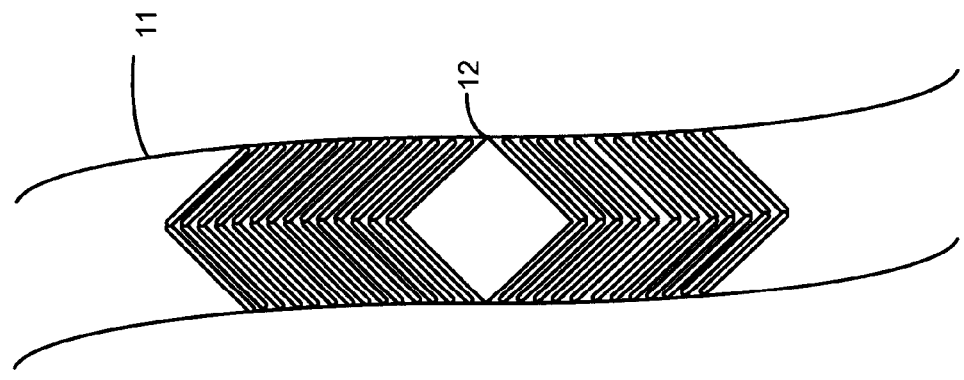
FIG. 1B is a block diagram illustrating an example of a metal-core herringbone graphite nanofiber utilized in thermal interface materials.

The detailed description explains the preferred embodiments of the invention, together with advantages and features, by way of example with reference to the drawings.

DETAILED DESCRIPTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

One or more exemplary embodiments of the invention are described below in detail. The disclosed embodiments are intended to be illustrative only since numerous modifications and variations therein will be apparent to those of ordinary skill in the art.

It is well established that the incorporation of certain types of carbon nanofibers into thermal interface material can impart thermal conductivity to such materials. Carbon nanofibers can be dispersed in thermal interface material by various well-known techniques. These techniques include, but are not limited to, melting, kneading and dispersive mixers to form an admixture that can be subsequently shaped to form a thermally conductive article.

Nanofibers are defined as fibers with diameters on the order of 100 nanometers. They can be produced by interfacial polymerization and electrospinning. Carbon nanofibers are graphitized fibers produced by catalytic synthesis around a catalytic core. The catalytic core around which graphite platelets 13 are formed is, for exemplary purposes, called a metal seed or a catalytic metal seed 12, wherein the catalytic metal seed 12 is a material having magnetic properties such as iron, cobalt, or nickel. Other non-metal materials suitable for forming magnetically alignable graphite nanofibers are within the scope of the invention.

Metal-core graphite nanofibers 11 can be grown in numerous shapes around a catalytic metal seed 12. One example embodiment of metal-core graphite nanofiber 11 having a diamond shaped catalytic metal seed 12 is shown in FIGS. 1A, 1B and 4A-4C. From the physical point of view, metal-core graphite nanofibers vary from 5 to 100 microns in length and are between 5 to 100 nm in diameter. The metal-core graphite nanofibers 11 comprise of graphite platelets 13 arranged in various orientations with respect to the long axis of the fiber, giving rise to assorted conformations. In one embodiment, a magnetic field is applied to the metal catalyst prior to deposition of the graphite nanofibers on the metal-core. With the application of a magnetic field, the magnetic poles of the seed are aligned with the magnetic field and will subsequently carry the attached graphite nanofibers along with them as they rotate in the applied field following deposition.

With a diamond shaped catalytic metal seed 12, the majority of the graphite platelets 13 will align along the fiber axis as dictated by an external magnetic field, so that the catalytic metal seed 12 may have its poles aligned perpendicular to or parallel to the external magnetic field. The seed particles are not limited to elongated diamonds, so that the deposited metal-core graphite nanofiber 11 forms the chevrons. The graphite platelets 13 can assume any of a myriad of shapes. If the catalytic metal seeds 12 are rectangular plates, then the graphite platelets 13 are deposited as plates. If the catalytic metal seeds 12 are cylindrical, then the graphite platelets 13 are deposited as cylindrical plates. If the catalytic metal seeds 12 are little bars, then the graphite platelets 13 are deposited as rectangular solids along the long axis of the rectangular bar. The graphite platelets 13 assume the geometry of the catalytic metal seed 12 surface.

Graphite nanofibers have received considerable attention in the electronics field due to their remarkable thermal conductivity. Moreover, the thermal conductivity of graphite nanofibers is anisotropic. Anisotropy is the property of being directionally dependent, as opposed to isotropy, which implies homogeneity in all directions. Therefore, the present invention takes advantage of the anisotropic nature of the graphite nanofibers by effectively aligning them along the conductive axis, thereby generating a thermal interface material with exceptional thermal conductivity at comparatively low loading levels.

A thermal interface material is used to fill the gaps between thermal transfer surfaces, such as between microprocessors and heatsinks, in order to increase thermal transfer efficiency. These gaps are normally filled with air which is a very poor conductor. A thermal interface material may take on many forms. The most common is the white-colored paste or thermal grease, typically silicone oil filled with aluminum oxide, zinc oxide, or boron nitride. Some brands of thermal interface materials use micronized or pulverized silver. Another type of thermal interface materials are the phase-change materials. The phase change materials are solid at room temperature, but liquefy and behave like grease at operating temperatures.

A phase change material is a substance with a high heat of fusion which, melting and solidifying at a certain temperature, is capable of storing and releasing large amounts of energy. Heat is absorbed or released when the material changes from solid to liquid and vice versa; thus, phase change materials are classified as latent heat storage units.

Phase change materials latent heat storage can be achieved through solid-solid, solid-liquid, solid-gas and liquid-gas phase change. However, the only phase change used for phase change materials is the solid-liquid change. Liquid-gas phase changes are not practical for use as thermal storage due to the large volumes or high pressures required to store the materials when in their gas phase. Liquid-gas transitions do have a higher heat of transformation than solid-liquid transitions. Solid-solid phase changes are typically very slow and have a rather low heat of transformation.

Initially, the solid-liquid phase change materials behave like sensible heat storage materials; their temperature rises as they absorb heat. Unlike conventional sensible heat storage, however, when phase change materials reach the temperature at which they change phase (i.e. melting temperature) they absorb large amounts of heat at an almost constant temperature. The phase change material continues to absorb heat without a significant rise in temperature until all the material is transformed to the liquid phase. When the ambient temperature around a liquid material falls, the phase change material solidifies, releasing its stored latent heat. A large number of phase change materials are available in any required temperature range from −5 up to 190° C. Within the human comfort range of 20° to 30° C., some phase change materials are very effective. They can store 5 to 14 times more heat per unit volume than conventional storage materials such as water, masonry, or rock.

Figure 2A:
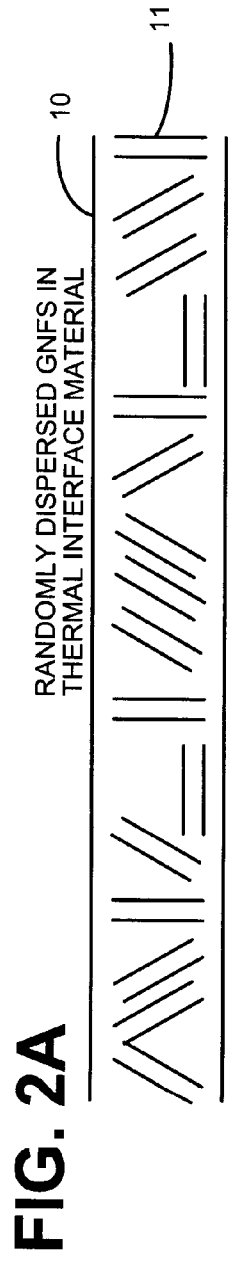
FIG. 2A is a block diagram illustrating an example of the thermal interface material with graphite nanofibers randomly dispersed in the thermal interface material.
Figure 2B:
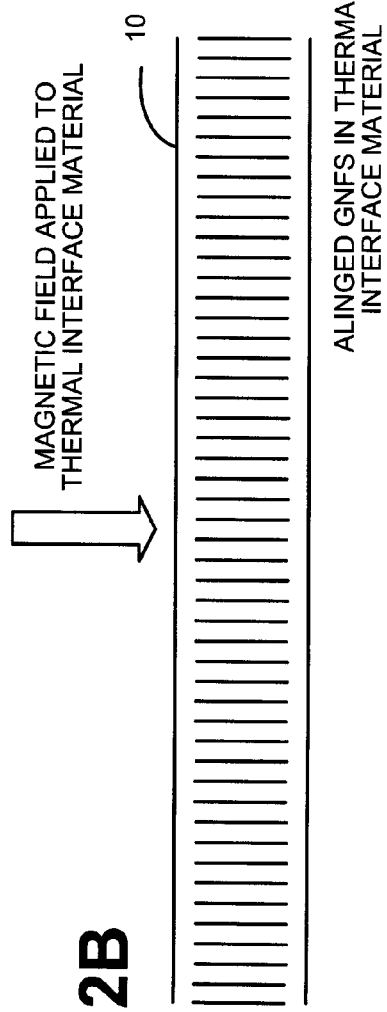
FIG. 2B is a block diagram illustrating an example of the thermal interface material with graphite nanofibers aligned by a magnetic field to orient the conductive axis in the desired direction in the thermal interface material.

When metal-core graphite nanofibers 11 are formulated into thermal interface materials 10 without further processing, the metal-core graphite nanofibers 11 are randomly distributed about the long axis of the thermal interface material as illustrated in FIG. 2A. The metal-core graphite nanofibers 11 lie at a multitude of orientations with respect to the mating surfaces. Consequently, the full benefit of the anisotropic nature of the thermal conductivity cannot be realized. If the catalytic metal seed 12 (FIGS. 1A and 1B) selected is magnetic (e.g., Ni or Co), the metal-core graphite nanofibers 11 can be dispersed into a suitable matrix and then aligned in a magnetic field to orient the conductive axis in the desired direction as illustrated in FIG. 2B. The alignment of the metal-core graphite nanofibers 11 on the conductive axis vastly improves the thermal conductivity of the thermal interface material 10.

For example, the thermal conductivity of a typical paraffinic phase change material can be increased 20× by incorporation of approximately 5 wt % randomly dispersed graphite nanofibers. The following operation of aligning graphite nanofibers results in axially aligned metal-core graphite nanofibers 11 in a phase change thermal interface material 10. The thermal conductivity of a typical paraffinic phase change material with graphite nanofibers can be increased by 300× through axially aligning the metal-core graphite nanofibers 11 using approximately 5 wt % graphite nanofibers.

Figure 2C:
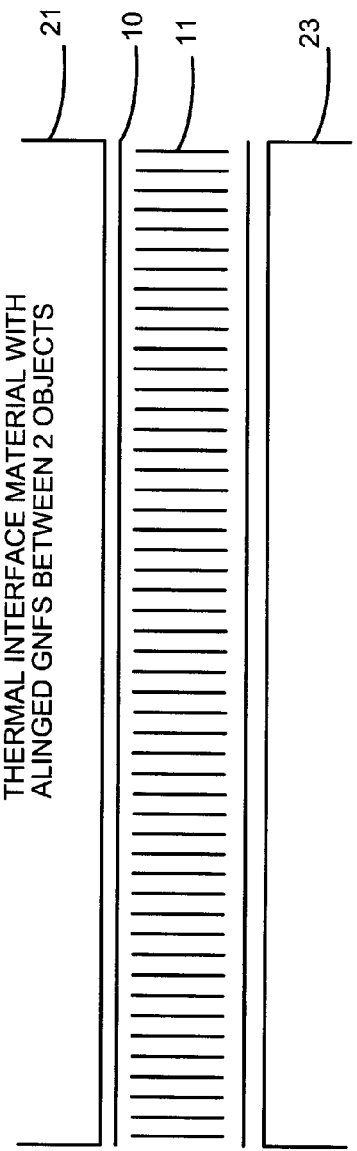
FIG. 2C is a block diagram illustrating an example of the thermal interface material with graphite nanofibers aligned by a magnetic field between two objects.

FIG. 2C is a block diagram illustrating an example of the thermal interface material 10 with metal-core graphite nanofibers 11 aligned by a magnetic field between two objects (21 and 23) respectively. In one embodiment, object 21 is typically an integrated circuit and object 23 is a printed circuit board. However, in other alternative embodiments, the thermal interface material 10 may be disposed between a vapor chamber and a lidded die, a cold plate and an integrated circuit/lidded die, or a cold plate and a heat-generating electronic component (e.g., a variable transformer module). In still other alternative embodiments, the thermal interface material 10 may be disposed between any heat generating component and any heat dissipating structure.

FIG. 3 is a flow chart illustrating an example of the method of the aligning metal-core graphite nanofibers in the aligning graphite nanofibers system 100 of the present invention.

At step 102, the aligning graphite nanofibers system 100 prepares the metal-core graphite nanofibers 11 in a herringbone configuration as per known literature methods. At step 103, the base phase change material is melted. In one embodiment, the base phase change material is melted at a temperature 10-20 C above the phase change materials melting temperature. In one embodiment, the base phase change material is a paraffin based material. In other embodiments, the base phase change material can be, but is not limited to, Paraffins ($C_nH_{2n+2}$); Fatty acids ($CH_3(CH_2)_{2n}COOH$); Metal Salt hydrates ($M_nH_2O$); and Eutectics (which tend to be solutions of salts in water). In still another embodiment, the graphite nanofibers can be dispersed in silicone-based gels or pastes that are used as thermal interface materials that are eventually cured into pads. Therefore, the same method can be used to align the graphite nanofibers in the silicone resin then cure the silicone and cut the pads to the desired footprint.

At step 104, the metal-core graphite nanofibers 11 are disbursed into the melt using well-established methods. In one embodiment, a high-speed dispersive mixer can be utilized. The amount of metal-core graphite nanofibers 11 in the base phase change material of the present invention will typically be in the range of 4 to 10 weight percent based on the amount of base phase change material, preferably ~5 weight percent. The metal-core graphite nanofibers 11 typically are dispersed essentially homogeneously throughout the bulk of the base phase change material.

At step 105, the phase change material is cast into a sheet mold. The temperature of the phase change material and cast is maintained at approximately the melting temperature acquired at step 103. At step 106, a magnetic field of sufficient intensity is applied to the phase change material containing the metal-core graphite nanofibers 11, in order to align the metal-core graphite nanofibers. In one embodiment, the long axis of the metal-core graphite nanofibers 11 are aligned in an orientation perpendicular to the mating surfaces. In another embodiment, the metal-core graphite nanofibers 11 are aligned along conductive axis of the graphite fibers. In still another embodiment, the magnetic field is normally within the range of 500-100,000 Gauss or 0.05-10 Tesla.

At step 107, the mold is cooled to approximately room temperature. Once the mold with the aligned metal-core graphite nanofibers 11 in the phase change material has cooled to appropriately room temperature, the thermal interface material is removed from the mold. In one embodiment, the room temperature is normally within the range of 60 to 80° F., or 11.5 to 26.5° C. At step 108, pads are cut to the desired footprint. Pads of appropriately sized geometry (length X and width Y thickness) are cut from the slab of material using conventional techniques known to those skilled in the art at step 108. The geometry is dictated by the footprint of the integrated circuit to which the thermal interface material will be mated.

Figure 4B:
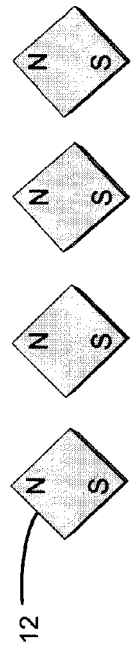
FIG. 4B is a block diagram illustrating an example of the pre-aligned metal seed particles used to create the aligned metal-core graphite nanofibers.
Figure 4A:
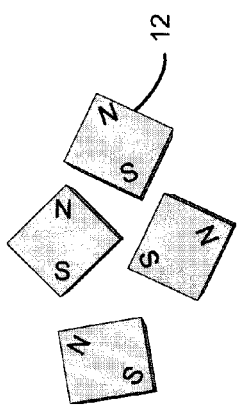
FIG. 4A is a block diagram illustrating an example of the randomly dispersed metal seed particles.

FIG. 4A is a block diagram illustrating an example of the randomly dispersed catalytic metal seeds 12. The catalytic metal seeds 12 are not limited to elongated diamonds, so that catalytic metal seeds 12 can assume any of a myriad of shapes including little bars. If the seed particles are rectangular plates, then the graphite platelets are deposit as plates, if the seed particles are cylindrical, then the graphite platelets deposit as cylindrical plates. The graphite platelets assume the geometry of the catalytic surface.

FIG. 4B is a block diagram illustrating an example of the pre-aligning catalytic metal seeds 12 used to create the aligned metal-core graphite nanofibers 11. Application of an external magnetic field can pre-align the magnetic poles of the catalytic metal seeds 12 by applying a magnetic field to the catalytic metal seeds 12 prior to deposition of the graphite platelets 13.

Figure 4C:
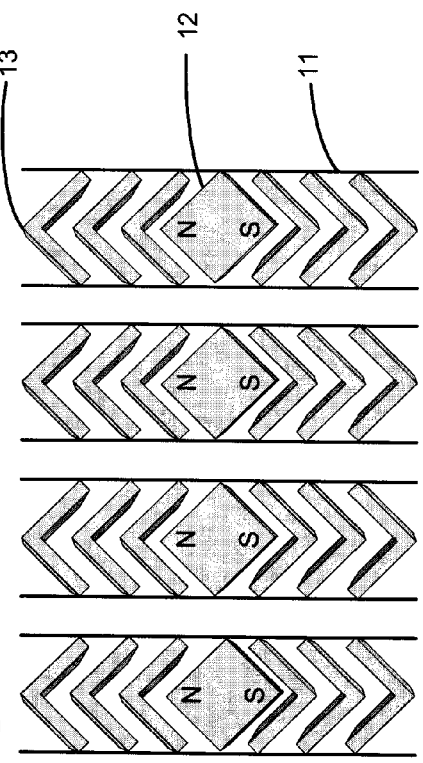
FIG. 4C is a block diagram illustrating an example of graphite platelets deposited on the pre-aligned metal seed particles to create the metal-core graphite nanofibers

FIG. 4C is a block diagram illustrating an example of graphite platelets 13 deposited on the pre-aligned catalytic metal seeds 12 to create the aligned metal-core graphite nanofibers 11. In one embodiment, the catalytic metal seeds 12 are aligned by a magnetic field to orient the conductive axis in the desired direction. The magnetic poles of the catalytic metal seeds 12 are aligned by a magnetic field (not shown) to orient the conductive axis in the desired direction and will subsequently carry the attached catalytic metal seeds 12 along with them as the catalytic metal seeds 12 rotate in the applied magnetic field following deposition.

FIG. 5 is a flow chart illustrating an example of the operation of the pre-aligning system 200 of the present invention, that pre-aligns the magnetic poles of a catalytic metal seeds 12 that creates the metal-core graphite nanofibers 11 dispersed in a thermal interface material 10. This can be accomplished by applying a magnetic field to the catalytic metal seed 12 prior to deposition of the graphite platelets 13. In this fashion, the magnetic poles of the catalytic metal seeds 12 are aligned the desired way and will subsequently carry the attached metal-core graphite nanofibers 11 along with the catalytic metal seed 12 as they rotate in the applied field following deposition.

At step 201, the catalytic metal seeds 12 are deposited in the disposition chamber. In an alternative embodiment, the catalytic metal seeds 12 are illustrated as little bars. The seeds particles are not limited to any particular shape. The seed particles can assume any of a myriad of shapes and, they can be formed as little bars. If the seed particles are rectangular plates, then the graphite platelets 13 deposit as plates; if the seed particles are cylindrical, then the graphite platelets 13 deposit as cylindrical plates. The graphite platelets 13 assume the geometry of the surface of the catalytic metal seed 12.

Next at step 202, a magnetic field of sufficient strength to cause the domains within the catalytic metal seeds 12 to align along the external field is applied. Application of an external magnetic field pre-aligns the magnetic poles of the catalytic metal seed 12 by applying a magnetic field to the catalytic metal seed 12 prior to deposition of the graphite platelets 13 on the metal-core.

At step 203, the chamber is charged with the reactive gas mixture. By judicious choice of the catalytic metal seeds 12 catalyst, the ratio of the hydrocarbon/hydrogen reactant mixture, and reaction conditions, it is possible to tailor the morphological characteristics, the degree of crystallinity, and the orientation of the precipitated graphite crystallites with regard to the fiber axis. In one embodiment, the catalytic synthesis uses carbon-containing gases that include, but are not limited to, ethylene-hydrogen mixtures, methane-hydrogen mixtures, Co—Co2-H2 mixtures, CO, CH4, acetylene and benzene have been used as the carbon-containing gases. In another embodiment, a Linz-Donawitz converter gas (LDG), of which the composition is approximately 67% CO, 16% CO2, 11% N2, 1.2% H2, 0.2% 02, and 0.6% H2O can be utilized. Other gas combinations are known in the art can also be utilized.

At step 204, the gas mixture thermally decomposes onto the catalytic metal seed 12 to generate the metal-core graphite nanofibers 11. At step 205, the base phase change material is melted. In one embodiment, the base phase change material is melted at a temperature 10-20 C above the phase change materials melting temperature. In one embodiment, the base phase change material is a paraffin based material. In other embodiments, the base phase change material can be, but is not limited to, Paraffins ($C_nH_{2n+2}$); Fatty acids ($CH_3(CH_2)_{2n}COOH$); Metal Salt hydrates ($M_nH_2O$); and Eutectics (which tend to be solutions of salts in water). In still another embodiment, the metal-core graphite nanofibers 11 can be dispersed in silicone-based gels or pastes that are used as thermal interface materials that are eventually cured into pads.

At step 206, the metal-core graphite nanofibers 11 are disbursed into the melt using well-established methods. In one embodiment, a high-speed dispersive mixer can be utilized. The amount of metal-core graphite nanofibers 11 in the base phase change material of the present invention will typically be in the range of 4 to 10 weight percent based on the amount of base phase change material, preferably ~5 weight percent. The metal-core graphite nanofibers 11 typically are dispersed essentially homogeneously throughout the bulk of the base phase change material.

At step 207, a magnetic field of sufficient intensity is applied to the phase change material containing the metal-core graphite nanofibers 11, in order to realign the metal-core graphite nanofibers 11 on their long axis. In one embodiment, the long axis of the metal-core graphite nanofibers 11 are aligned in an orientation perpendicular to the mating surfaces. In another embodiment, the metal-core graphite nanofibers 11 are aligned along the conductive axis of the graphite fibers. In still another embodiment, the magnetic field is normally within the range of 500-100,000 Gauss or 0.05-10 Tesla.

At step 208, the phase change material with the metal-core graphite nanofibers 11 is cooled to approximately room temperature. Once the phase change material with the metal-core graphite nanofibers 11 has cooled to appropriately room temperature, the phase change material is inundated with the metal-core graphite nanofibers 11 aligned in the preferred direction. In one embodiment, the room temperature is normally within the range of 60 to 80° F., or 11.5 to 26.5° C.

At step 209, the phase change material with the aligned metal-core graphite nanofibers 11 is cut to the desired footprint. Pads of appropriately sized geometry (length X and width Y thickness) are cut from the slab of material using conventional techniques known to those skilled in the art.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the functionality, and operation of possible implementations of systems and methods according to various embodiments of the present invention. In this regard, each block in the flowchart or block diagrams may represent a module, segment, or task to be performed, which comprises one or more executable steps for implementing the specified function(s). It should also be noted that, in some alternative implementations, the functions noted in the block may occur out of the order noted in the Figures. For example, two blocks shown in succession may in fact be performed substantially concurrently or the blocks may sometimes be executed in the reverse order, depending upon the functionality involved.

It should be emphasized that the above-described embodiments of the present invention, particularly any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A method for aligning graphite nanofibers in a thermal interface material to enhance the thermal interface material performance, comprising:
    creating the graphite nanofibers from graphite particles in a configuration around a magnetic catalytic seed;
    dispersing the graphite nanofibers into the thermal interface material;
    applying a magnetic field of sufficient intensity to align the graphite nanofibers in the thermal interface material.

2. The method of claim 1, wherein the magnetic catalytic seed is metal.

3. The method of claim 1, comprising:
    casting the thermal interface material into a sheet mold; and
    cutting the thermal interface material into a desired footprint.

4. The method of claim 1, wherein the graphite particles are in a herringbone configuration around the catalytic seed in the graphite nanofibers.

5. The method of claim 1, wherein the graphite nanofibers are aligned along the conductive axis of the graphite fibers.

6. The method of claim 5, wherein the graphite nanofibers are aligned perpendicular to mating surfaces of the thermal interface material.

7. The method of claim 1, wherein the graphite nanofibers in the base phase change material are in the range of 4 to 10 weight percent based on the amount of base phase change material.

8. The method of claim 1, wherein the graphite nanofibers in the base phase change material are approximately 5 weight percent.

9. A system for aligning graphite nanofibers in a thermal interface material to enhance the thermal interface material performance, comprising:
    a means for creating the graphite nanofibers from graphite particles in a configuration around a magnetic catalytic seed;
    a means for dispersing the graphite nanofibers into the thermal interface material;
    a means for applying a magnetic field of sufficient intensity to align the graphite nanofibers in the thermal interface material.

10. The system of claim 9, wherein the magnetic catalytic seed is metal.

11. The system of claim 9, comprising:
   a means for casting the thermal interface material into a sheet mold; and
   a means for cutting the thermal interface material into a desired footprint.

12. The system of claim 9, wherein the graphite particles are in a herringbone configuration around the catalytic seed in the graphite nanofibers.

13. The system of claim 9, wherein the graphite nanofibers are aligned along the conductive axis of the graphite fibers.

14. The system of claim 9, wherein the graphite nanofibers are aligned perpendicular to mating surfaces of the thermal interface material.

15. The system of claim 9, wherein the graphite nanofibers in the base phase change material are in the range of 4 to 10 weight percent based on the amount of base phase change material.

16. The system of claim 9, wherein the graphite nanofibers in the base phase change material are approximately 5 weight percent.

17. A method for aligning carbon nanofibers (CNFs) in a thermal interface material to enhance the thermal interface material performance, comprising:
   applying a first magnetic field of sufficient intensity to align magnetic catalytic metal seeds;
   creating the CNFs from carbon particles configured around the magnetic catalytic metal seed;
   dispersing the CNFs into the thermal interface material;
   applying a second magnetic field of sufficient intensity to align the CNFs in the thermal interface material; and
   cutting the thermal interface material into a desired footprint.

18. The method of claim 17, wherein the CNFs are aligned along the conductive axis of the graphite fibers.

19. The method of claim 17, wherein the CNFs are aligned perpendicular to mating surfaces of the desired footprint.

\* \* \* \* \*